(12) United States Patent
Gießibl

(10) Patent No.: US 10,151,652 B2
(45) Date of Patent: Dec. 11, 2018

(54) APPARATUS FOR DETERMINING EXTERNAL STRAY MAGNETIC FIELDS ON A MAGNETIC FIELD SENSOR

(71) Applicant: Methode Electronics Malta Ltd., Mriehel (MT)

(72) Inventor: Johannes Gießibl, Amerang (DE)

(73) Assignee: METHODE ELECTRONICS MALTA LTD., Mriehel (MT)

( * ) Notice: Subject to any disclaimer, the term of this patent is extended or adjusted under 35 U.S.C. 154(b) by 227 days.

(21) Appl. No.: 15/376,911

(22) Filed: Dec. 13, 2016

(65) Prior Publication Data
US 2017/0176273 A1   Jun. 22, 2017

(30) Foreign Application Priority Data
Dec. 17, 2015  (DE) .......................... 10 2015 122 154

(51) Int. Cl.
*G01L 3/10* (2006.01)
(52) U.S. Cl.
CPC .................................. *G01L 3/105* (2013.01)
(58) Field of Classification Search
CPC ........................................................ G01L 3/105
USPC ...... 73/862.321, 862.325, 862.331–862.335; 324/244, 207.11–207.15, 207.2, 207.21, 324/207.25
See application file for complete search history.

(56) References Cited

U.S. PATENT DOCUMENTS

| | | | | |
|---|---|---|---|---|
| 4,506,554 A | * | 3/1985 | Blomkvist | G01L 3/102 73/862.334 |
| 4,627,298 A | * | 12/1986 | Sahashi | G01L 3/102 324/209 |
| 4,760,745 A | * | 8/1988 | Garshelis | G01L 3/102 73/862.333 |
| 4,773,874 A | * | 9/1988 | Kopeski, Jr. | H01R 13/6392 439/369 |
| 4,976,160 A | * | 12/1990 | Dobler | G01L 3/102 73/779 |
| 4,989,460 A | * | 2/1991 | Mizuno | G01L 3/102 73/862.335 |

(Continued)

FOREIGN PATENT DOCUMENTS

| | | |
|---|---|---|
| DE | 277521 C | 5/1913 |
| DE | 10 2005 002 966 A1 | 9/2005 |

(Continued)

OTHER PUBLICATIONS

U.S. Appl. No. 15/285,735, filed Oct. 5, 2016.

*Primary Examiner* — Jonathan Dunlap
(74) *Attorney, Agent, or Firm* — Thompson Coburn LLP

(57) ABSTRACT

An apparatus is provided for detecting an external magnetic field and/or a product-related magnetic field on a ferromagnetic component, which has a magnetization in the form of magnetic tracks. The apparatus comprises at least two magnetic field sensors which can detect an external magnetic field acting on the ferromagnetic component. Each magnetic field sensor comprises two coils, wherein each coil is assigned at least one magnetic track. Each two coils are configured so that they have a different sensitivity to one another, wherein one coil which has a higher sensitivity with respect to the other coil. The coil having the higher sensitivity ensures that the effect of an external magnetic field is amplified.

19 Claims, 4 Drawing Sheets

(56) References Cited

U.S. PATENT DOCUMENTS

| | | | | |
|---|---|---|---|---|
| 5,351,555 A * | 10/1994 | Garshelis | G01L 3/102 336/30 |
| 5,646,356 A * | 7/1997 | Ling | G01L 3/102 73/862.333 |
| 5,889,215 A * | 3/1999 | Kilmartin | G01L 3/102 73/862.333 |
| 6,047,605 A * | 4/2000 | Garshelis | G01L 3/102 73/862.333 |
| 6,222,363 B1 * | 4/2001 | Cripe | G01L 3/102 324/225 |
| 6,341,534 B1 * | 1/2002 | Dombrowski | G01D 3/02 324/209 |
| 6,532,832 B2 * | 3/2003 | Shahcheraghi | G01L 3/102 73/862.333 |
| 6,553,847 B2 | 4/2003 | Garshelis | |
| 6,581,480 B1 * | 6/2003 | May | G01L 3/102 73/862.333 |
| 6,826,969 B1 * | 12/2004 | May | G01L 3/105 73/862.331 |
| 6,904,814 B2 * | 6/2005 | May | G01L 3/101 73/862.333 |
| 6,910,391 B1 * | 6/2005 | May | G01L 3/102 73/862.333 |
| 7,143,656 B2 * | 12/2006 | Wan | G01L 3/102 73/862.331 |
| 7,302,867 B2 * | 12/2007 | May | G01L 3/101 148/103 |
| 7,363,827 B2 * | 4/2008 | Hedayat | G01L 3/102 148/100 |
| 7,469,604 B2 * | 12/2008 | Hedayat | G01L 3/102 148/100 |
| 7,493,831 B2 * | 2/2009 | Varonis | F16C 19/52 73/862.333 |
| 7,895,906 B2 * | 3/2011 | Hedayat | G01L 3/104 73/862.333 |
| 8,001,849 B2 | 8/2011 | Weng | |
| 8,001,850 B2 * | 8/2011 | Hedayat | G01L 3/104 73/862.331 |
| 8,087,304 B2 * | 1/2012 | Lee | G01R 33/07 324/207.11 |
| 8,191,431 B2 * | 6/2012 | Hedayat | G01L 3/104 73/862.331 |
| 8,578,794 B2 | 11/2013 | Lee | |
| 8,893,562 B2 * | 11/2014 | Barraco | G01L 3/102 73/862 |
| 9,683,906 B2 * | 6/2017 | Gießibl | G01L 3/104 |
| 9,958,295 B2 * | 5/2018 | Gie ibl | G01D 5/2013 |
| 2007/0089539 A1 * | 4/2007 | Hedayat | G01L 3/102 73/862.331 |
| 2007/0113683 A1 * | 5/2007 | Hedayat | G01L 3/102 73/862.331 |
| 2007/0247224 A1 * | 10/2007 | May | G01L 3/102 330/63 |
| 2009/0165571 A1 * | 7/2009 | Hedayat | G01L 3/102 73/862.333 |
| 2009/0230953 A1 * | 9/2009 | Lee | G01L 3/102 324/244 |
| 2010/0077869 A1 * | 4/2010 | Hedayat | G01L 3/102 73/862.333 |
| 2010/0242626 A1 * | 9/2010 | Weng | G01L 3/102 73/862.333 |
| 2011/0162464 A1 | 7/2011 | Weng | |
| 2011/0265581 A1 * | 11/2011 | Hedayat | G01L 3/102 73/862.333 |
| 2012/0074933 A1 | 3/2012 | Lee | |
| 2013/0125669 A1 | 5/2013 | Barraco et al. | |
| 2016/0209863 A1 | 7/2016 | Stringos | |
| 2017/0089732 A1 | 3/2017 | Gießibl | |
| 2017/0089772 A1 | 3/2017 | Gießibl | |

FOREIGN PATENT DOCUMENTS

| | | |
|---|---|---|
| EP | 2793009 A1 | 10/2014 |
| EP | 2799827 A1 | 11/2014 |

* cited by examiner

APPARATUS FOR DETERMINING EXTERNAL STRAY MAGNETIC FIELDS ON A MAGNETIC FIELD SENSOR

RELATED APPLICATION DATA

This application claims the benefit of German Patent Application serial no. DE 10 2015 122 154.3 filed on Dec. 17, 2015, the disclosure of which is incorporated by reference herein.

FIELD OF THE DISCLOSURE

The disclosure relates to an apparatus for determining an external magnetic influence with at least two magnetic field sensors having coils with a different magnetic sensitivity.

BACKGROUND

Magnetic field sensors are used for measuring magnetic fields. These are sensors which convert the magnetic flux or the magnetic field strength into an electrical quantity. Since magnetic field sensors are contactless, reliable and wear-free sensors, which can be produced relatively cheaply, they are frequently used for the detection of other physical quantities: for pressure, for fill level, rotational speed, current, rotational movement, torque, directional changes, and others. Magnetic field sensors include, inter alia, Hall sensors and magneto-resistive sensors. So-called fluxgate sensors, also called saturation core probes or Foerster probes, are high-sensitivity magnetic field sensors. The magneto-elastic technology uses basic mechanical and magnetic properties of the material to measure various parameters. In this case, measurements are made of changes in the properties of magnetic fields which accompany a change in the mechanical properties, for example, the shear stressing under the action of external forces on a magnetic component. The technology is applied by directly magnetizing a mechanical elements instead of attaching additional elements such as, for example, a ring. Highly sensitive fluxgate sensors which are located in the immediate vicinity of the magnetized element identify the change in the magnetic field properties which are proportional to the applied force. These changes are linear and reproducible within the elastic limits of the material. They are precise under normal application conditions.

Examples for this technology overall are found in numerous patent specifications. They can be designated as product-related magnetic fields since they usually act on the magnetic field of the respective product.

An apparatus for measuring forces or moments is already deduced from DE 277 521 A1. According to this, a measuring device is described which accomplishes the contactless measurement of forces or moments at fixed or rotating deformation bodies on the basis of the magneto-elastic effect. The deformation body of the apparatus comprises the deformation body itself, at least two zones of thin amorphous metal layers applied to the surface of the body and sensor coils assigned to these zones. The measuring device measures surface stresses as a consequence of force or moment effects on cantilevers, force measuring bolts, torsion shafts, etc.

In this case, a sensor coil is assigned to each surface zone of the deformation body which either surrounds the deformation body in the region of the coated surface zone or is arranged in the form of an air coil or at the shortest possible distance from the surface zone.

Further deduced from DE 10 2005 002 966 A1 is an apparatus for determining power of operating means which provides the use of additional redundant sensors for measurement of the torque present on a shaft part.

EP 2 793 009 A1 additionally describes an elongate shaft which has magneto-active fields which are magnetized radially in opposite directions. These magnetized fields are assigned magneto-elastic sensors. The shaft including its magneto-elastic fields is subjected to a tensile and/or compressive loading.

Known from U.S. Pat. No. 8,578,794 A1 is a torque sensor which comprises an elongate body and magneto-elastic active fields which are connected directly or indirectly to the body or which form a part of the body. A torque exerted on the body is transferred proportionally to the active field which includes at least one magnetically polarized field. Signals of the magnetic field sensor are processed in such a manner that effects of a magnetic near field are compensated.

Furthermore EP 2 799 827 A1 discloses a magneto-elastic torque sensor comprising a hollow elongate body at least in some regions and a magneto-elastic active field acting on the inner surface of the body. The torque sensor comprises a plurality of magnetic field sensors which are arranged in the interior of the hollow body in some regions.

U.S. Pat. No. 6,553,847 B2 deduces a torque sensor, in particular a contactless magneto-elastic torque sensor for providing a measure for the torque which is applied to a shaft.

A torque sensor comprises a magneto-elastically active region on a shaft exposed to a torque and a magnetic field sensor.

The magnetic field sensor is attached in the vicinity of the magneto-elastic region and is oriented in relation to this in order to detect the magnitude of the magnetic field of the sensor device and provide the output signal as a response to this.

US 2012/0074933 A1 discloses a method and an apparatus for eliminating a field noise in a torque sensor. For this purpose three sets of magnetic field sensors and relevant coils are placed on a shaft. The first set is arranged in a central region of the shaft. The second and the third set of field sensors are each arranged on the right and the left side of the field sensor of the central region. All the coils are connected to one another and jointly emit a sensor signal. According to this prior art however, only the end result can be identified. There is no scope for differentiated identification in relation to the basic parameters such as, for example, torque, stress etc. There is also no scope for determining what is actually happening.

Known from US 2011/0162464 A1 is an apparatus comprising at least two magnetic field sensors wherein in addition to a product-related magnetic field, an external magnetic field can be compensated. In this case, sensor arrangements comprising one set of sensors and comprising a plurality of sets of sensors are disclosed, wherein one set of sensors is localized in the region of a magnetic track or in the region of a plurality of magnetic tracks and the other sets of sensors are localized close by but without any specific assignment of individual coils to individual magnetic tracks.

The document US 2013/0125669 A1 also discloses an apparatus comprising at least two magnetic field sensors and discloses a measurement arrangement comprising a pair of sensors and comprising a set of sensors consisting of three sensors, wherein each sensor is assigned a coil and an appurtenant magnetic track; furthermore, the possibility of a corresponding expansion with other pairs of sensors or other sets of sensors each consisting of three sensors is addressed.

The document U.S. Pat. No. 8,001,849 B2 discloses sensor arrangements comprising a plurality of sensors wherein at least one sensor is localized in the region of a magneto-elastic zone and at least one further sensor is localized close by or further away but without a specific assignment of individual coils to individual magnetic tracks.

SUMMARY

So far no devices are known from the prior art by means of which it is possible to be able to determine magnetic influences which are based on the basis of defects, magnetic interference effects or other external influences and act on the magnetic field of a magnetized body. Such external influences can, for example, originate from environmental and ambient influences, e.g. power lines and rail lines. External magnetic fields are thereby produced which can result in an influencing of the afore-mentioned product-related magnetic fields, in particular to an influencing of the field strength due to the product-related magnetic field. Such additional influencing parameters can in particular be of relevance when magnetic field sensors detect auxiliary effects which are undesired in the detection per se as a result of manufacturing tolerances.

Starting from this prior art, its disadvantages and shortcomings and in the attempt to be able to fulfil industrial target requirements, for example, of automobile and/or aerospace technology, it is the object of the present invention to provide magnetic field sensors which in particular can identify external magnetic fields acting on products to be checked.

These external magnetic fields are also designated as stray magnetic fields.

It is particularly desirable to be able to identify in addition to the product-related magnetic fields also those magnetic fields as such which are not product-related and which are based on external influences, possibly originate from environmental influences e.g. from power lines, rail lines. The aim is therefore in particular to be able to distinguish between the sources of the magnetic fields which occur.

It is furthermore the object of the invention to provide an apparatus which offers the possibility of identifying external magnetic influences on the apparatus, detecting different signal behaviour caused by this and determining external influences on the magnetization.

It is furthermore the object of the invention to further identify by detecting external magnetic influences by means of the apparatus whether products related to the apparatus are for their part subjected to influences, e.g. functional disturbances.

By determining such signal deviations, safety standards in the area of automobile and/or aerospace engineering can be maintained.

The apparatus should make it possible to measure magnetic effects, for example, punctiform external fields. A punctiform magnetic field is in particular a major disadvantage in particular in the near region of a magnetic field sensor.

It is further desirable that such an apparatus functions precisely and free from maintenance. The apparatus should be simple to use. It should be inexpensive and easy to manufacture.

If for example a torque is acting on a shaft, this can be detected with a torque sensor. In particular, in automobile, bicycle, domestic appliance and machine tool technology and/or aerospace technology, industrial target requirements are imposed to be able to detect not only torque-related but also external magnetic fields with the aid of torque sensors.

Industry therefore additionally requires the provision of an apparatus which is able to detect signals other than possibly torque-related ones or a different signal behaviour and therefore is able to delimit from the influences possibly a targeted effect on the torque and thereby possibly determine influences on the magnetic field which occur independently of such a targeted effect or other influences on the magnetization.

The terms magneto-elastic sensor and magnetic field sensor are used synonymously within the framework of the explanation of the invention.

External Magnetic Fields:

Such magnetic fields other than product-related ones and possibly torque-related signals for, for example, as set out, may be caused by defects, interference effects and other influences of an in particular upstream or downstream product to be checked, on a magnetized region. These additional influential parameters possible originating from environmental influences such as, for example power lines, rail lines, can produce external magnetic fields and have an influence on the detection of magnetic fields which, as explained above should be detected per se by the magnetic field sensors as a result of directly product-related quasi-targeted effects, possibly caused by the torque. These external magnetic fields can in particular be of relevance when magnetic field sensors detect auxiliary influences which are not desired in the detection per se, for example, as a result of manufacturing tolerances which, when evaluating the detected results, it is not clear that these are results which not only reproduce the targeted effects possibly on the torque but which are influenced by such external events. The aim is therefore in particular to be able to distinguish between the sources of the magnetic fields which occur.

In the sense of the present invention the term "detection" is to be understood as the recording and/or evaluation of magnetized waves and/or relaying the signal produced as a result.

As a result, in particular deviations from safety standards in the area of aeronautics and automobile engineering, bicycle technology, household equipment, machine tools and other areas should be determined and these safety standards can be adhered to.

The non-product-related magnetic fields are designated here as external magnetic or as external magnetic fields.

How this is achieved according to the present invention will be explained after the following presentation of the components according to the apparatus and the associated magneto-elastic basic functions.

Magnetized Body—Ferromagnetic Component:

Both the product-related and also the external magnetic fields are in an operative relationship to a magnetized body.

The magnetized body can be an elongate body, for example a cylindrical body, a conically tapering body or a shaft.

It is further assumed that the magnetized body is a ferromagnetic component.

The ferromagnetic component is at least partially provided with a ferromagnetic material. Hardenable steel having a nickel (Ni) or chromium (Cr) fraction is suitable as such ferromagnetic material. It is however understood that other ferromagnetic materials can also be used.

The ferromagnetic component can be configured, for example, as a drive shaft or as a Pitman arm shaft. Preferably the ferromagnetic component is disposed in an air, land or water vehicle. The ferromagnetic component can, for example, also be used in an industrial device or a domestic appliance.

The ferromagnetic component comprises at least one magnetized region, which has at least three magnetic tracks with oppositely directed magnetizations.

The magnetic field emitted by the ferromagnetic component and to be detected is produced by applying a so-called stress in the material to the ferromagnetic component. This can be accomplished, for example, by action with torque.

The magnetic-field relevant, in particular magneto-elastic effect obtained in cooperation with the type of magnetization is produced at the ferromagnetic component and is expressed as a magnetic variation of which the axial component is measured by the magnetic field sensor.

As described however, such a magnetic field variation can not only be obtained as a result of directly product-related influences but also as a result of external influences, so-called interfering influences.

Dual-Dual-Band Magnetization:

An arrangement of the ferromagnetic component with three magnetic tracks is assumed hereinafter.

The three magnetic tracks each directed oppositely to one another are detected according to the invention axially to a ferromagnetic component of four magnetic coils in each case, of which respectively two are assigned to one (first and second) magnetic field sensor (dual-dual-band magnetization). One magnetic coil of two magnetic field sensors thus detects at least one magnetic track, namely usually the central one in the case of three magnetic tracks directed oppositely to one another, of which the adjacent oppositely directed ones are magnetized.

The magnetic field sensors or magnetic coils are arranged at a distance from one another and radially to the ferromagnetic component.

The dual-dual-band sensor arrangement is used for better and differentiated evaluation of an actual state or possible deviations, e.g. as a result of faults and defects, of the product to be tested because at least two comparative quantities are obtained by this means which can be detected from the respective voltage of at least two magnetic tracks by a magnetic field sensor and the voltage of at least two magnetic tracks by another magnetic field sensor.

Furthermore, as a result of the spatially narrow arrangement of the magnetic tracks to be discussed further, it is possible that the external magnetic field differences between the positions of the magnetic track channels are as small as possible.

Hereinafter it is described as a first group in relation to the first outer and central magnetic track and of a second group in relation to the central, and third, therefore second outer magnetic track.

The arrangement of the three magnetic tracks each directed opposite to one another constitutes an advantageous combination of two dual-dual band magnetic tracks. The combination of the two dual-band tracks is achieved by axially displacing the second dual-band arrangement and using the central track jointly.

This results in the advantage that one magnetic track can be dispensed with and thus a spatial merging of the magnetic tracks can be provided so that a more uniform measurement picture is produced as a result and less axial installation space is required.

In the case of a magnetization with three circumferential magnetic tracks, the magnetic track arranged spatially on the left is for example positively magnetized, the central magnetic track is negatively magnetized and the right magnetic track is again positively magnetized or conversely.

As a result of the magneto-elastic effect which occurs due to stress in the ferromagnetic component, there is a difference from the oppositely directed magnetization of the magnetic tracks. The difference is expressed in a magnetic field variation, of which the axial component is measured by the magnetic field sensor. The occurrence of stress is sufficiently known in this connection in the prior art and is therefore not explained further hereinafter.

Preferably in each case at least one coil of a first magnetic field sensor can be assigned to the first outer and central magnetic track to detect one signal each radially to the ferromagnetic component. Subsequently for simplification there is only talk of the first outer magnetic track in relation to the first outer magnetic track.

Preferably in each case at least one coil of a second magnetic field sensor can be assigned to the central and third magnetic track to detect a signal radially to the ferromagnetic component. This third magnetic track is also designated as second outer magnetic track in the presently described magnetization.

The sets of information resulting from the evaluation of the first outer and central magnetic track which can be a track-related partial signal can be related to one another. Likewise the sets of information resulting from the evaluation of the central and third magnetic track which can be a track-related partial signal can also be related to one another.

From these two sets of track-related information the first magnetic field sensor evaluates a signal. Likewise the second magnetic field sensor evaluates such a signal from the two sets of track-related information.

The signal detected by the first magnetic field sensor can be related to the signal detected by the second magnetic field sensor and the two signals always behave in the opposite manner as long as the measured magnetic field is produced by a stress applied to the component.

Interaction Between Magnetic Field Sensor and Coil:

In this connection, it is clarified that the subsequently described interaction of at least two magnetic field sensors and at least two coils and their spatial arrangement compared to the ferromagnetic arrangements applies in principle both for the detection of the product-related magnetic fields and also for the detection of the afore-mentioned external magnetic fields.

In the dual-dual-band sensor arrangement the first outer and the central magnetic tracks are each assigned a coil which measures the axial component of the magnetic field produced as a result of the magneto-elastic effect.

The first magnetic track and the central magnetic track are each assigned at least one coil of a first magnetic field sensor radially to the ferromagnetic component. As set out, the at least one coil in each case is radially spaced apart from the ferromagnetic component; this also applies to the at least one coil in each case which are assigned to the central and the second magnetic coil. The coils assigned to the first and central magnetic track on the one hand and the central and second magnetic track on the other hand are each arranged axially at a distance from one another and to one another. They must be arranged radially at the same distance from the ferromagnetic component. An angularly-offset arrangement of the two sensor channels with respect to one another with respect to the ferromagnetic component is also possible.

Notwithstanding this, the first coil of each magnetic field sensor is arranged so that this detects a change in the magnetic field of a magnetic track in a first direction on the surface of the ferromagnetic component.

The second coil of each magnetic field sensor is arranged so that it detects a variation of the magnetic field of a magnetic track in a second opposite direction on the surface of the ferromagnetic component. The evaluation electronics of the magnetic field sensor emits a signal.

Thus, in an arrangement of three magnetic tracks, the second coil of the first magnetic field sensor and the first coil of the second magnetic field sensor each detect the central magnetic track.

The magnetic field sensor thus receives at least one signal due to the coils and evaluates this, optionally whilst transmitting to a separate display unit.

If there is a signal in a so-called dual-dual-band configuration which relates to the first and the central magnetic track, this is evaluated and transmitted as first signal. The first signal is obtained from a first difference evaluation of the following information from the two opposite magnetic tracks (first magnetic track and central magnetic track). For example, the first signal can be a measured quantity in volts or millivolts but also any other measured quantity.

The further signal of the magnetic field sensor in the configuration of a dual-dual-band configuration which relates to the central magnetic track and the third magnetic track is also evaluated and transmitted as second signal. The second signal is also obtained from a first difference evaluation of the following information from the two opposite magnetic tracks. The measured quantity is usually in units of "volts" or "millivolts" but it can also be any other measured quantity.

The output signals of the respective magnetic field sensors are oppositely directed as a result of the fact that one group measures a negative polarization of the difference and the other group measures a positive polarization of the difference.

Before the detection of the external magnetic fields and the interference effects is discussed subsequently, it should be noted that such a detection is also possible in the case of magnetic field sensors in which further coils are disposed at a different location of the circumferential lateral surface of the ferromagnetic component. Thus, for the sake of completeness, this constructive configuration will be initially discussed.

These further coils for the same magnetic field sensors are arranged at a different location of the circumferential lateral surface of the ferromagnetic component, preferably they are offset by 180 degrees. By this means sensor measurements can be made at various locations of the circumferential lateral surface of a track and as a result, an average value can be determined which provides a higher accuracy.

As a result, additional measured values are obtained, which can compensate for a reduction in the influence of the magnetic strength on the magnetic field sensor by in particular radial distance of the ferromagnetic component, possibly due to rotational movement or possibly due to manufacturing tolerances, from the previously described coils of the magnetic field sensor.

Additional coils of the respective sensors can be arranged in the region of the circumferential lateral surface so that reliable measurements are possible even with transverse movements of the ferromagnetic component in its radial plane and associated influences of the magnetic strength. Accordingly they can be arranged circumferentially at any position in the region of the 360° circumferential lateral surface of the ferromagnetic component.

It should be pointed out that it is particularly advantageous if preferably respectively two coils of different magnetic field sensors are spaced apart from one another by 90° with respect to the next preferably two coils of respectively different magnetic field sensors. This results in an arrangement of four pairs of coils which are each assigned to different sensors, at a distance of 90°, 360° circumferentially.

In this case, coils can also be used not only for the same but for other magnetic field sensors which is at the discretion of the person skilled in the art, in particular taking into account the electronics used.

Magnetic Field Sensors

The magnetic field sensors are highly sensitive measuring devices for detecting extremely small magnetic fields.

The magnetic field sensors preferably work on a fluxgate basis. The fluxgate sensor is a highly sensitive measuring device for detecting extremely small magnetic fields.

Hall sensors, for example, can also be used as magnetic field sensors in the sense of the present invention.

It should be noted however that any suitable type of magnetic field sensors can be used according to the invention.

Insofar as there is talk of a coil within the framework of the invention, here this is preferably a wire winding with an amorphous core which is used as a measuring coil. The coils are therefore arranged axially (parallel) and radially to the ferromagnetic component in such a manner that they can detect both product-related magnetic fields produced by application of stress and also external magnetic fields possibly produced by interference effects. However, they can be configured so that they can distinguish these magnetic fields from one another, which will be described in detail hereinafter.

The coils of the respective magnetic field sensor are connected to an evaluation electronics which can be arranged spatially at another location of the device.

Coils Having Different Sensitivity:

The influential parameters originating from environmental influences such as power lines or railway lines produce external magnetic fields. The external magnetic fields, in the same way as the product-related magnetic fields, have an influence on the sensors assigned to the magnetic tracks.

According to the invention, a device is disclosed which detects external stray magnetic fields and also product-related magnetic fields in relation to a ferromagnetic component and:

as already set out above, comprises at least two magnetic field sensors which can detect an external and product-related magnetic field acting on a ferromagnetic component, wherein at least two coils are assigned to each magnetic field sensor, one channel for transporting information is assigned to each coil, the coils are suitable and intended to be able to detect a magnetic field the coils are furthermore preferably suitable and intended to be able to detect different strengths of a magnetic field that coil of the magnetic field sensor which, compared to the other coil of the magnetic field sensor, can detect a lower strength of the external or product-related magnetic field in the case of application, has a sensitivity which differs from the sensitivity of the other coil which can detect a higher strength of the external or the product-related magnetic field in the case of application.

Those coils of the magnetic field sensors which are arranged in the region of higher strength of the external magnetic field have a higher sensitivity. This results in a rectified amplification of the signals due to the influence of the magnetic field in relation to the signals coming from the two magnetic field sensors.

That coil having the higher sensitivity is arranged closest to the spatial end of the ferromagnetic component compared to the other coils. This applies similarly in the spatial relationship of the axial arrangement of the magnetic field sensors with respect to one another.

At least two coils each are provided to form each channel of a magnetic field sensor. In each channel of the magnetic field sensor, the coil which is subject to the influence of an external magnetic field to a greater extent than the other coil of the channel has a higher sensitivity than the other coil of the channel. The same applies to the second channel of the magnetic field sensor. The external magnetic field thus in principle exerts a rectified influence in each case on both magnetic field sensors.

The coil of the magnetic field sensor which has a lower sensitivity compared to the other coil of the magnetic field sensor in relation to the strength of the external magnetic field is arranged spatially further from the end of the ferromagnetic component than the coil of the magnetic field sensor which has a higher sensitivity in relation to the strength of the external magnetic field, since as expected, a smaller external influence is to be expected at this position.

The field strength of the external magnetic field is greater in the area of the spatial end of the ferromagnetic component than in the region of the ferromagnetic component located at a further distance therefrom.

The magnetic field sensors are arranged axially to the ferromagnetic component in the region of increased concentration of the external magnetic field.

That coil of the magnetic field sensor which is exposed to the influence of the magnetic field to a greater extent as a result of the smaller spatial proximity to the source of the external magnetic field therefore has a higher sensitivity relative to the other coil.

The increased influence of the external magnetic field in the coil of the magnetic field sensor in the case of magnetic field sensors arranged axially to the ferromagnetic component and coils arranged accordingly axially to the ferromagnetic component is, for example, based on the fact that one coil of the magnetic field sensor is arranged spatially closer to the source of the external magnetic field than the other coil of the same magnetic field sensor which is arranged axially at a greater distance.

The magnetic fields measured by the coils of the magnetic field sensors are relayed to an evaluation and/or display unit.

Spatial Arrangement of the Magnetic Field Sensor:

The magnetic field sensors are each arranged according to the available space relationships preferably outside the space formed by a magnetic equilibrium of the ferromagnetic component. The distance is in this case only determined according to the space relationships.

They can, for example be arranged spatially at a distance, e.g. axially spaced apart from the spatial end of the ferromagnetic component, in particular a shaft. The spatial end of the ferromagnetic component acts in practice as an antenna tip in relation to the external magnetic field.

The magnetic field sensors detect or measure preferably initially the magnetic flux density and field strength of the magnetic field which is produced by stress and relay the results in a form which can be evaluated preferably to an electronic device for signal processing and/or for display.

In their axial arrangement relative to the magnetized body or to the ferromagnetic component, furthermore each of the two magnetic field sensors is exposed to a different-strength magnetic field of the external magnetic field.

If the two magnetic field sensors are arranged axially to the magnetized body or to the ferromagnetic component, that magnetic field which lies closest to the magnetic field having the higher flux density is exposed to a stronger magnetic field. This is frequently that magnetic field sensor which is closer to the component end of the ferromagnetic component.

Detecting the Influence of Product-Related Magnetic Field and an External Stray Magnetic Field:

The external stray magnetic fields result in the formation of a magnetic field gradient due to a regional concentration of a magnetic field.

In order to detect the influence of external stray magnetic fields and therefore in order to detect the influence of the magnetic field gradient, which occurs due to the component geometry, and for the purpose of achieving the different sensitivity, each individual magnetic field sensor according to the invention has two individual channels.

The respective channel with the coil comprises the medium via which the signal transmission takes place and also the entire transmission path from a transmitter to a receiver.

The effect of the external magnetic field on the two magnetic field sensors depends on the sensitivity of its coils. Here it is possible to control the sensitivity of the respective coil by variation of the number of windings of the coil.

In the same way as the at least two coils of each magnetic field sensor are able to detect the influence of magnetic fields produced as a result of the action of a force, they can also detect external stray magnetic fields.

For this purpose the coils of the magnetic field sensor assigned to the respective channels preferably initially detect the magnetic fields formed on the surface of the ferromagnetic component as a result of the application of stress, e.g. application of a torque.

The stress and the magnetic field based thereon behave linearly. This also applies with a view to effects of force of varying magnitude.

The application of a torque to the ferromagnetic component brings about an increase in the magnetic field as a result of the oppositely magnetized magnetic tracks in relation to the one coil and a reduction in the magnetic field in the case of the other coil. The extent of the applied torque can be derived as a result of the resulting gradients of the magnetic fields.

If the ferromagnetic component is now additionally subject to an external magnetic field, this results in a corresponding increase in the magnetic field of both coils, i.e. also the coil for which a reduction of the magnetic field stress occurs on application of a torque.

In the case of possibly an error tolerance of one coil, the situation can arise where, when an external magnetic field occurs, the channel which displays an increase in the magnetic field when detecting an external magnetic field in the opposite direction now again displays a reduction in the magnetic field and thus seems to suggest that only a product-related torque increase has acted on the ferromagnetic component. In order to avoid this result occurring as a result of product tolerances, the sensors, as already described, are arranged so that those coils of the magnetic field sensors which are arranged closer to the end of the ferromagnetic component have a higher sensitivity.

In the case of a coil therefore which on the one hand is arranged closer to the end of the ferromagnetic component and which on the other hand does not have a higher sensitivity than the other coil, it cannot therefore occur that a signal caused by an external magnetic field goes in the wrong direction in the course of its detection. An essential aspect of the invention is thus obtained from configuring the device so that it has at least one coil which is arranged in the region of the ferromagnetic component so that when an external magnetic field occurs on this, it comes the closest to this magnetic field compared with the other coils.

The arrangement is, as described, usually arranged eccentrically of the ferromagnetic component because this position is spatially closer to the external magnetic field recorded in each case. The coil of both channels which is arranged closest to the external magnetic field has a higher sensitivity. By this means the effect of the external magnetic field is amplified and it is ensured that overall both channels of the magnetic field sensor react correctly to the external magnetic field despite any error tolerances of a magnetic field sensor. This ensures a reliable detection of the influence of the external magnetic coil.

Consequently a deliberate amplification of the signal is involved. The coil which is arranged closer to the stray magnetic field measures a larger magnetic field.

The selection of the sensor having the higher sensitivity or the adjustment of the sensor to a higher sensitivity can easily be made by the person skilled in the art and depends substantially on the expected usage conditions of the device, the material of the ferromagnetic component etc.

Purely as an example, the foregoing will be explained by means of fictitious values without the invention being only approximately restricted to such an exemplary embodiment.

It should be assumed that one channel (two coils) of the magnetic field sensor records a voltage value of 2.5 V in the neutral state of the shaft and the other channel also records 2.5 V. If a torque is now applied to the shaft, the voltage value of the first channel is increased to 3.0 V in this example case whilst the voltage value of the second channel is reduced to 2.0 V as a result of the oppositely magnetized magnetic tracks assigned to it. As a result of the gradient thereby produced, it is clear to the person skilled in the art that an action of a torque on the shaft has taken place.

If this shaft additionally comes into the region of an external magnetic field after the action of a torque, it should be assumed that in the example case the voltage value for both channels is increased by 0.2 V so that this is now 3.2 V for the first channel whereas it is then 2.2 V for the second channel. As a result of the resulting gradient, the person skilled in the art identifies that the magnetic field has changed due to external influences. This result would be obtained with precisely operating magnetic field sensors which are not subject to any manufacturing tolerances.

In the case of a magnetic field sensor subject to a manufacturing tolerance, the last-mentioned example could however have the result that the second channel does not record an increase in the voltage value but displays a (further) reduction of the voltages, i.e. possible a reduction from 2.0 V (after the action of a torque) to for example 1.8 V. As a result of the (described) oppositely magnetized magnetic tracks, to which this second channel is assigned, the person skilled in the art could therefore have the incorrect view that an (amplified or additional) action of torque on the shaft has taken place.

This erroneous effect is eliminated by the coil which is located closer to the end of the ferromagnetic component (magnetic field concentration/antenna effect) and which thus lies spatially closest to the stray magnetic field in the case of practical application, having a higher sensitivity and thus bringing about a targeted amplification of the error signal caused by the external stray field.

The present invention also functions when a product-related magnetic field is not present but only an external magnetic field can be determined. In this case, however, the signals acting on both sensors do not vary differentially but in parallel.

When an external field occurs, a parallel shift of the signals takes place. In the case of a product-related magnetic field, an opposite movement of the signals is detected.

In the presence of only one external magnetic field, the invention functions in principle precisely as described above.

DESCRIPTION OF THE DRAWINGS

Further aspects and characteristics of the invention are obtained from the following description of preferred embodiment of the invention according to FIGS. 1 to 3.

DETAILED DESCRIPTION

Figure 1:
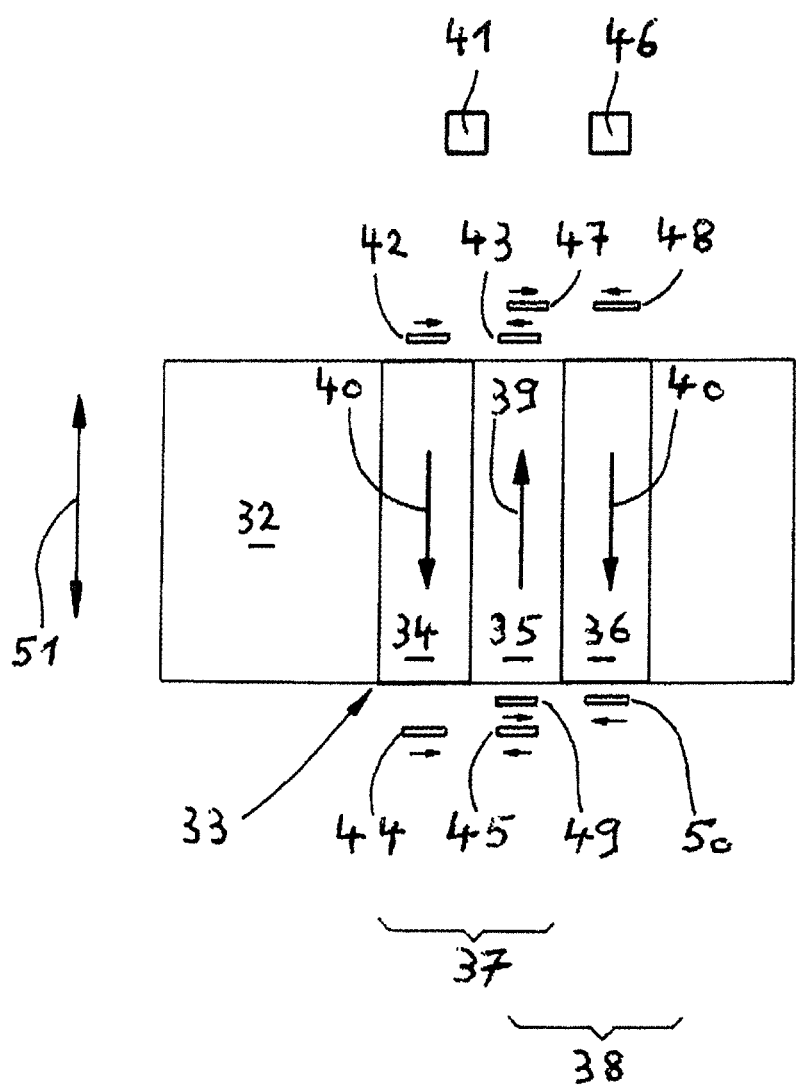
FIG. 1 shows in schematic view, a ferromagnetic component, in particular a shaft having three magnetic tracks surrounding the shaft.

FIG. 1 shows a ferromagnetic component 32 with a magnetized region 33. The magnetized region 33 comprises three magnetic tracks 34, 35, 36. The neighbouring magnetic tracks 34, 35, 36 each have an opposite circumferential magnetization 39, 40. The magnetic track 34 and the magnetic track 36 have a circumferential magnetization 40. The common magnetic track 35 has a magnetization 39 opposite to 40.

The magnetized region 33 is divided into two groups 37, 38.

The magnetic tracks 34 and 35 are assigned to the first group 37 of the magnetized region 33.

The magnetic tracks 35 and 36 are assigned to the second group 38 of the magnetized region 33. Both groups 37, 38 of magnetic tracks 34, 35, 36 have the magnetic track 35 in common.

A first magnetic field sensor 41 is assigned to the magnetic tracks 34, 35. The first magnetic field sensor 41 comprises the coils 42, 43 and optionally the coils 44, 45 when a movement of the ferromagnetic component 32 in the radial direction should be able to be detected. A compensation for the change in distance is thereby accomplished. In other words: the integral of the distances of the coils to the surface of the ferromagnetic component 32 is kept constant.

The second magnetic field sensor 46 of the second group 38 comprises at least the coils 47, 48, wherein optionally the coils 49, 50 are required in order to compensate for radial movements and serve to improve rotation-dependent errors.

The magnetic field sensors 41, 46 are arranged in such a manner that the ferromagnetic component 32, preferably the shaft, extends between the coils 42 or 44, 43 or 45, 47 or 49 and 48 or 50.

The arrangement of the ferromagnetic component 32 between the coils 42, 43, 47, 48 and the coils 44, 45, 49, 50 enables the ferromagnetic component 32 to move away from the coils 42, 43, 47, 48 in each case during a radial movement 51 between the coils 42, 43, 47, 48 and 44, 45, 49, 50 and at the same time approach the coils 44, 45, 49, 50 and conversely.

Regardless of the radial movement 51 of the ferromagnetic component 32, in this way the magnetic tracks 34, 35, 36 always remain in the region of action either of the coils 42, 43, 47, 48 or of the coils 44, 45, 49, 50 of the appurtenant magnetic field sensors 41 or 46. The functionality of the magnetic field sensors 41 or 46 thus remains independent of the radial movement 51 of the ferromagnetic component 32 within the coils 42, 43, 47, 48 and 44, 45, 49, 50.

Since the magnetic track 35 is jointly assigned to the first magnet track group 37 and the second magnetic track group 38, the two coils 43 and 45 of the first magnetic field sensor 41 and the two coils 47 and 49 of the magnetic field sensor 46 are assigned to the magnetic track 35.

Figure 2:
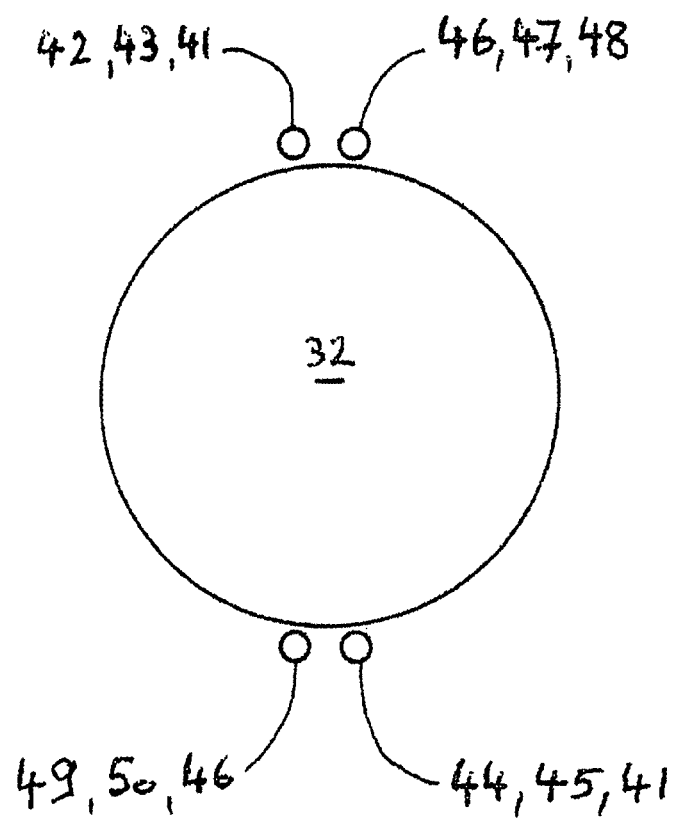
FIG. 2 shows the cross-section of the ferromagnetic component, in particular the shaft with magnetic field sensors arranged on the respective upper and lower side of the shaft.

In FIG. 2 the coils 43, 47 on the one hand and 45, 49 on the other hand are shown vertically, that is above one another and below one another. These central coils sit precisely at the same position in the axial direction, except that they are arranged rotationally according to the required installation space. The distance to the ferromagnetic component 1, in particular to the shaft surface is identical.

In FIG. 1 the magnetic field sensor 46 assumes the function of a redundant magnetic field sensor.

FIG. 2 shows in cross-section the ferromagnetic component 32 with the magnetic field sensor 41 with its coils 42 and 43 arranged at the top and the second magnetic field sensor 46 with the coils 47, 48 also arranged at the top.

The second magnetic field sensor 46 with extra coils 49 and 50 can be arranged offset relative to the ferromagnetic component 32 on its underside. The first magnetic field sensor 41 with coils 44 and 45 is also shown opposite on the underside of the ferromagnetic component 32. These are optional if radial movement of the shaft is to be expected.

FIG. 2 shows the structural offset of the magnetic field sensors in such a manner that the coils 42, 43 of the first magnetic field sensor 41 are arranged on the upper side of the ferromagnetic component 32 diagonally opposite the coils 44 and 45 of the first magnetic field sensor 41 on the underside of the ferromagnetic component 32.

In the same way on the upper side of the ferromagnetic component 32 the coils 47, 48 of the second magnetic field sensor 46 are arranged diagonally at 180° with respect to the coils 49, 50 of the second magnetic field sensor 15 on the underside of the ferromagnetic component 1.

Figure 3:
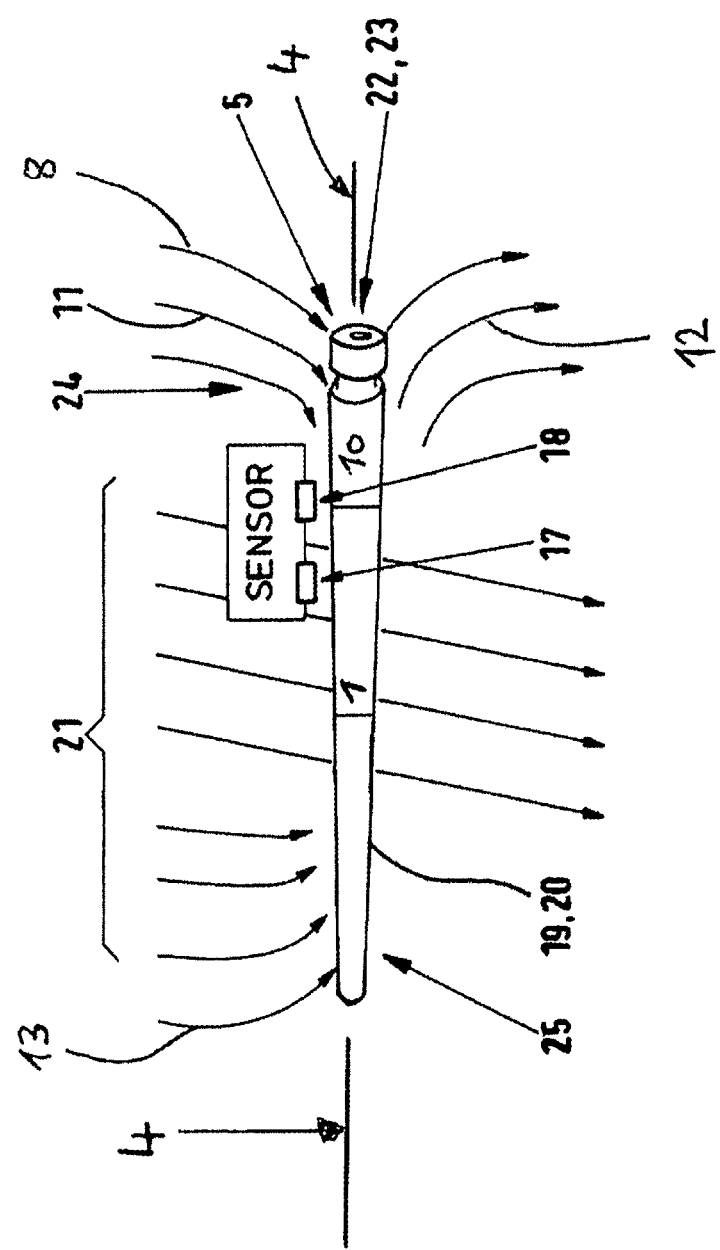
FIG. 3 shows a ferromagnetic body in the form of a Pitman arm shaft with axially arranged magnetic field sensors and FIG. 4 shows a view according to FIG. 1.

In FIG. 3 the ferromagnetic component 1 is rotatable about an axis of rotation 4. A magnetized metallene body (not shown) is arranged in the area of the front end 5 of the ferromagnetic component 1.

The external stray magnetic field (source not shown) emits a magnetic field with magnetic field lines 11, 8, 13, 21, 12.

The ferromagnetic component 1 functions as a magnetic field antenna 10; the magnetic field lines (not shown) are concentrated at its front end 5 in the region 14.

The magnetic field antenna 10 receives magnetic field lines 11, 8, 13, 15 and at the same time releases magnetic field lines 12 of the external magnetic field.

The ferromagnetic component 1 thus comprises a magnetic field 13 which has at least one magnetic field gradient at least at one end of the ferromagnetic component.

That is, if there is a gradient at one end, the other end also has one.

Two magnetic field sensors 17, 18 are arranged axially to the ferromagnetic component 1 (ferromagnetic component). The magnetic field sensor 18 is exposed to a stronger external magnetic field than the magnetic field sensor 17 as a result of the greater proximity to the source of the external magnetic field (not shown).

This is based on the fact that the ferromagnetic component 1 acts as magnetic field antenna 10 and the magnetic field of the ferromagnetic component 1 is compressed in the region 24 as a result of the crossing of the magnetic field lines 8, 11.

The reference number 21 shows the magnetic field region having smaller gradients which acts on the ferromagnetic component 1.

As a result of its larger spatial distance from the amplified magnetic field 24 in the region of the ferromagnetic component 1, the magnetic field sensor 17 is exposed to the amplified magnetic field 24 to a lesser extent.

The signals detected by the magnetic field sensors 17, 18 are relayed to an evaluation and/or display unit (not shown).

In FIG. 3 the ferromagnetic component 1 is shown as a Pitman arm shaft 19.

The ferromagnetic component 1 has a front end 5 and a rear end 25 opposite this.

The ferromagnetic component 1 comprises a magnetic field 21. Its front end 23 is configured as magnetic field concentration region 22.

The magnetic field lines 11, 21 originating externally are led over to the ferromagnetic component 1 acting as magnetic field antenna.

This produces a concentrated magnetic field 24 at the front end 23 and rear end 25 of the ferromagnetic component 1.

The magnetic field region 24 of the ferromagnetic component 1 is more highly concentrated by the magnetic field lines 11 compared with the remaining magnetic field 21 of the Pitman arm shaft 19.

Since the magnetic field of the ferromagnetic component 1 has a higher density in the region 24 than in the remaining region 21, in the case of FIG. 2 a magnetic field gradient is present at the Pitman arm shaft 19 from the ends towards the centre.

Figure 4:
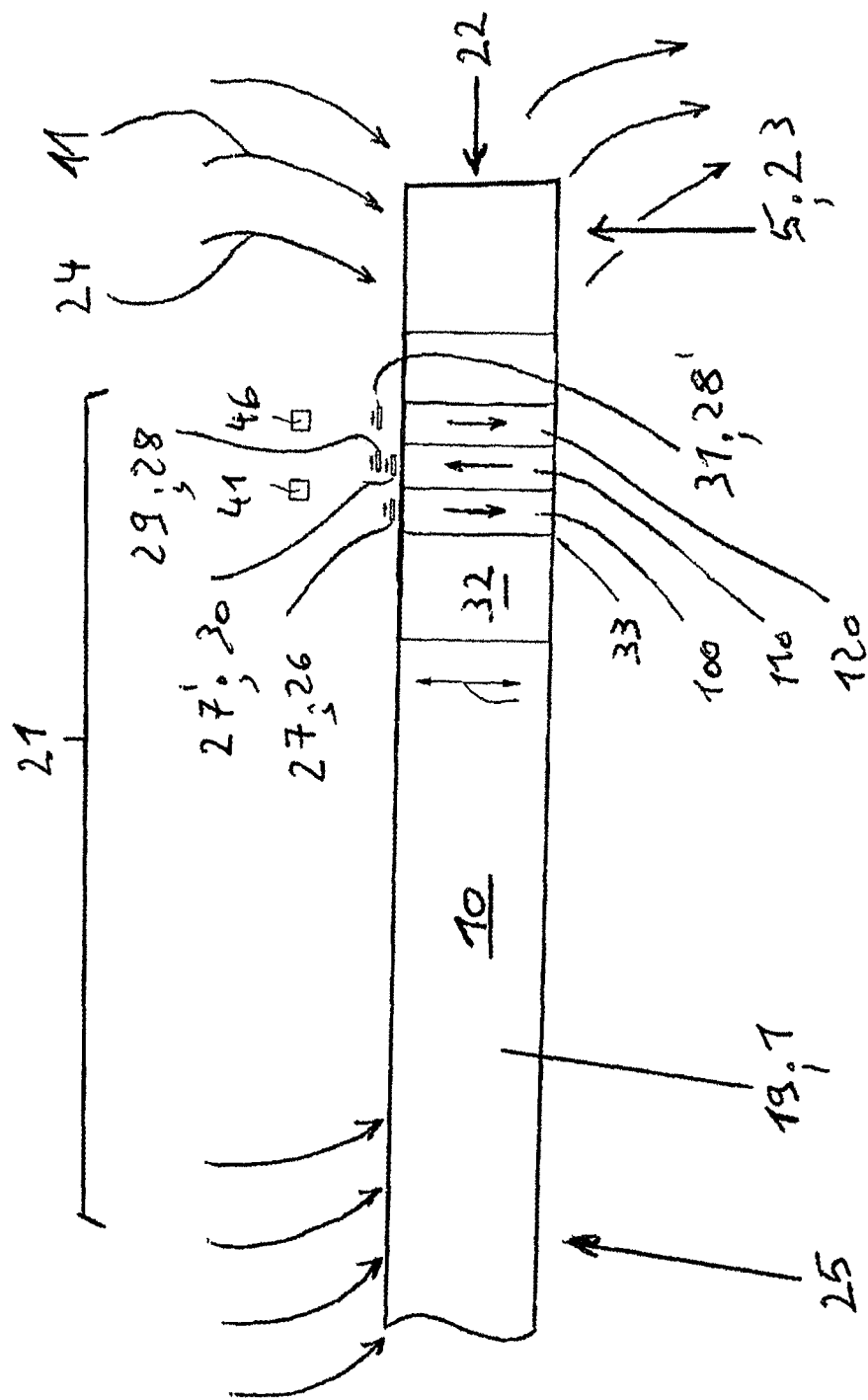

The magnetic field sensors 17 and 18 are arranged outside the magnetic equilibrium both in FIG. 3 and in FIG. 4.

In FIG. 3 as a result of the proximity of its arrangement to the more highly concentrated magnetic field 24 of the Pitman arm shaft 19, the magnetic field sensor 18 is exposed to a stronger magnetic field than the magnetic field sensor 17.

FIG. 4 shows the Pitman arm shaft 19 with its front end 5 and the opposite rear end 25. Comparably to FIG. 3 in FIG. 4 the Pitman arm shaft 19 is also the ferromagnetic component 1. The Pitman arm shaft 19 comprises a magnetic field 21, wherein the front end 23 of the Pitman arm shaft 19 is shown as magnetic field concentration region 22.

The magnetic field lines 11 and 21 emanating from the external magnetic field are lead over to the Pitman arm shaft 19 which is configured as magnetic field antenna 10 in the diagram in FIG. 3.

As a result of the transition of the magnetic field lines 11, 21 to the Pitman arm shaft 19, concentrated magnetic fields 24 and 25 are formed at both ends 23, 25 of the Pitman arm shaft 19.

The magnetic field lines 11 amplify the magnetic field region 24 of the Pitman arm shaft 19 with respect to the remaining magnetic field 21 of the Pitman arm shaft 19.

As a result of the higher density of the magnetic field 24 of the Pitman arm shaft 19 compared with the remaining magnetic field lines 21 of the Pitman arm shaft 19, a magnetic field gradient is formed on the Pitman arm shaft 19 of FIG. 4 from the ends towards the centre of the Pitman arm shaft 19.

According to FIG. 4, the magnetic field sensors 41 and 46 in FIG. 5 are positioned outside the magnetic equilibrium.

As a result of the proximity of the arrangement to the more highly concentrated magnetic field 24 of the Pitman arm shaft 19, the magnetic field sensor 46 is exposed to a stronger magnetic field than the magnetic field sensor 41.

Two magnetic field sensors 41 and 46 are shown in each case in FIG. 4.

In FIG. 4 each of the magnetic field sensors 41, 46 has two coils. Two coils are provided to form each sensor, which is arranged at a radial distance from the ferromagnetic component 1.

The magnetic field sensor 41 comprises the coils 27, 28 for its formation in FIG. 4 whereas the magnetic field sensor 46 of FIG. 4 comprises the coils 27' and 28' for its formation in each case.

In FIG. 4 three magnetic tracks 100, 110, 120 of a dual-dual-band magnetization are shown on the ferromagnetic component 1. Each of the magnetic tracks 100, 110, 120 is assigned a coil 27, 28, 27', 28' of the magnetic field sensor 41, 46. The coils 27, 28, 27', 28' of the magnetic field sensors are arranged so that they detect a change of the magnetic tracks 100, 110, 120 on the surface of the ferromagnetic component 1.

The coil 28 of the magnetic field sensor 46 is axially at the same height as the coil 27' of the magnetic field sensor 41 with respect to the Pitman arm shaft 19, only offset by the position which is occupied by the coil 27' of the magnetic field sensor. The second coil 28' of the magnetic field sensor 46 is axial to the Pitman arm shaft 19 at the same height as the magnetization 120.

In FIG. 4, as a result of its greater distance with respect to the region 24 of highly compressed magnetic field lines of the ferromagnetic component 1, the coil 27 of the magnetic field sensor 41 and the coil 27' of the magnetic field sensor 46 have a lower sensitivity than the coil 28 of the magnetic field sensor 41 and the coil 28' of the magnetic field sensor 46 which lie geographically closer to the front region of concentrated magnetic field lines 24 of the Pitman arm shaft 19.

REFERENCE LIST

1. Ferromagnetic component
2. Not assigned
3. Not assigned
4. Axis of rotation
5. Front end of the ferromagnetic component
6. Not assigned
7. Driving disk as example of a magnetized body
8. Magnetic field line of the external stray magnetic field
9. Not assigned
10. Magnetic field antenna in configuration of a ferromagnetic component 1
11. Magnetic field line of the external stray magnetic field
12. Magnetic field lines (outgoing)
13. Magnetic field lines (ingoing)
14. Region of highly compressed magnetic field lines (schematic)
15. Region of non-highly compressed (still gradient) magnetic field lines (schematic)
16. Not assigned
17. Magnetic field sensor
18. Magnetic field sensor
19. Pitman arm shaft as example of a magnetized body
20. Not assigned
21. Magnetic field lines (ingoing)
22. Magnetic field concentration region
23. Front end of ferromagnetic component
24. Front region of concentrated magnetic field
25. Rear region of concentrated magnetic field
26. Channel
27. Coil
28. Coil
29. Channel
30. Channel
31. Channel
27' Coil
28' Coil
32 Ferromagnetic component
33 Magnetized region
34 Magnetic track
35 Common magnetic track
36 Magnetic track
37 Group
38 Group
39 Magnetization
40 Magnetization
41 First sensor; first group
42 Coil
43 Coil
44 Coil
45 Coil
46 First sensor; second group
47 Coil
48 Coil
49 Coil
50 Coil
51 Radial movement
52 Not assigned
53 Not assigned
63 Coil
100 Magnetic track
110 Magnetic track
120 Magnetic track
130 Magnetic track

What is claimed is:

1. An apparatus for detecting at least one of an external magnetic field and a product-related magnetic field on a ferromagnetic component (1, 19), wherein the ferromagnetic component (1, 19) has a magnetization from a plurality of magnetic tracks (34, 35, 36; 100, 110, 120), the apparatus comprising at least two magnetic field sensors (17, 18, 41, 46) being configured to detect an external magnetic field (11, 21) acting on the ferromagnetic component (1, 19), each magnetic field sensor (17, 18, 41, 46) comprising two coils (27, 28, 27', 28'), each coil (27, 28, 27', 28') being assigned to at least one magnetic track (34, 35, 36, 39) with two coils (27, 28, 27', 28') of each magnetic field sensor (17, 18, 41, 46) being configured so that they have a different sensitivity to one another, the one coil (27, 28, 27', 28'), having a higher sensitivity with respect to the other coil (27, 28, 27', 28'), being arranged closer to an end of the ferromagnetic component (1, 19) than the coil (27, 28, 27', 28') having the lower sensitivity, such that an effect of the external magnetic field is amplified.

2. The apparatus according to claim 1, characterized in that the magnetic field sensors (17, 18; 41, 46) are spaced apart at least one of axially and radially with respect to one another in relation to the ferromagnetic component (1, 19).

3. The apparatus according to claim 1, characterized in that at least one of the magnetic field sensors (17, 18; 41, 46) and one of the coils (27, 28, 27', 28') are configured for detecting the product-related and also for detecting the external magnetic field.

4. The apparatus according to claim 1, characterized in that the individual magnetic tracks (34, 35, 36) have an opposite magnetization (39, 40) with respect to one another.

5. The apparatus according to claim 1, characterized in that the magnetic tracks (34, 35, 36; 100, 110, 120) form a combination of two dual-band magnetic tracks mirrored with respect to one another (34 and 35, or 35 and 36; 100 and 110 or 110 and 120), wherein the central magnetic track (35, 100) is used jointly by the magnetic field sensors (17 and 18 or 41 and 46).

6. The apparatus according to claim 5, characterized in that the magnetic track (35; 110) used jointly by both magnetic field sensors (17, 18; 41, 46) has the same positive or negative polarization.

7. The apparatus according to claim 1, characterized in that the coils (27, 28, 27', 28') with the higher sensitivity amplify the signal emanating from the external magnetic field.

8. The apparatus according to claim 1, characterized in that the magnetic field sensor (46) is adapted to function as a redundant magnetic field sensor.

9. The apparatus according to claim 1, characterized in that the ferromagnetic component (1, 19) is a magnetic field antenna (10).

10. The apparatus according to claim 1, characterized in that the coils (27, 28, 27', 28') are spaced equally apart from one another.

11. The apparatus according to claim 1, characterized in that the signals emitted by the coils (27, 28, 27', 28') of the magnetic field sensors (17, 18; 41, 46) are relayed to an evaluation and/or display unit.

12. A method for detecting at least one of an external magnetic field and a product-related magnetic field on a ferromagnetic component (1, 19), wherein the ferromagnetic component (1, 19) has magnetization in the form of magnetic tracks (34, 35, 36; 100, 110, 120), the method comprising:
arranging two magnetic field sensors (17 and 18, or 41 and 46) relative to the ferromagnetic component (1, 19) in a manner such the magnetic field sensors (17, 18, 41, 46) detect an external magnetic field (11, 21) acting on the ferromagnetic component (1, 19), wherein each magnetic field sensor (17, 18, 41, 46) comprises two coils (27, 28, 27', 28') and the two coils (27 and 27', 28 and 28') of each magnetic field sensor are configured that they have a different sensitivity with respect to one another, wherein each coil (27, 28, 27', 28') is assigned to at least one magnetic track (34, 35, 36; 100, 110, 120), wherein the coil (27', 28') having a higher sensitivity with respect to the other coil (27, 28, 27', 28') is arranged closer to the at least one end of the ferromagnetic component (1, 19) than the coil (27, 28, 27', 28') having the lower sensitivity such that the effect of an external magnetic field is amplified.

13. The method of claim 12 wherein the step of arranging the magnetic field sensors includes arranging the magnetic field sensors (17, 18; 41, 46) to be spaced apart at least one of axially and radially with respect to one another in relation to the ferromagnetic component (1, 19).

14. The method of claim 12 wherein the step of arranging the magnetic field sensors includes configuring at least one of the magnetic field sensors (17, 18; 41, 46) and one of the coils (27, 28, 27', 28') for detecting the product-related and also for detecting the external magnetic field.

15. The method of claim 12 wherein the step of arranging the magnetic field sensors includes configuring at least two of the magnetic field sensors (17, 18 or 41, 46) to cooperate with a central magnetic track (35, 100) of the magnetic tracks (34, 35, 36; 100).

16. The method of claim 12 wherein the step of arranging the magnetic field sensors includes configuring the coils (27, 28, 27', 28') with the higher sensitivity to amplify the signal emanating from the external magnetic field.

17. The method of claim 12 wherein the step of arranging the magnetic field sensors includes configuring the magnetic field sensor (46) to function as a redundant magnetic field sensor.

18. The method of claim 12 wherein the step of arranging the magnetic field sensors includes arranging the coils (27, 28, 27', 28') to be spaced equally apart from one another.

19. The method of claim 12 further comprising providing at least one of an evaluation and display unit to receive signals emitted by the coils (27, 28, 27', 28') of the magnetic field sensors (17, 18; 41, 46).

* * * * *